United States Patent
Kobayashi et al.

(10) Patent No.: US 6,384,470 B2
(45) Date of Patent: May 7, 2002

(54) CONTACT TERMINAL ELEMENT, CONTACT TERMINAL DEVICE

(75) Inventors: Kunio Kobayashi; Shigeru Takada; Isao Asaka, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/759,357

(22) Filed: Jan. 16, 2001

(30) Foreign Application Priority Data

Jul. 12, 2000 (JP) .......................................... 2000-211909

(51) Int. Cl.⁷ ............................................... H01L 29/40
(52) U.S. Cl. ........................................ 257/621; 257/741
(58) Field of Search .................................. 257/666, 734, 257/741, 621

(56) References Cited

U.S. PATENT DOCUMENTS 4,653,186 A * 3/1987 Kamijo et al. ................. 29/838

\* cited by examiner

*Primary Examiner*—Roy Potter
(74) *Attorney, Agent, or Firm*—McDermott, Will & Emery

(57) ABSTRACT

There are described contact terminals which enable stable measurement of electrical characteristics of semiconductor devices. A heat-resistant insulating film having a plurality of apertures formed therein is sandwiched between an upper metal mold and a lower metal mold. The upper and lower metal molds are positioned, and conductive resin is poured into the cavity defined between the upper and lower metal molds, thereby producing a plurality of contact terminals. After removal of the upper and lower metal molds, there is produced a heat-resistant film having a plurality of contact terminals formed thereon.

2 Claims, 6 Drawing Sheets

*Fig. 1C1*
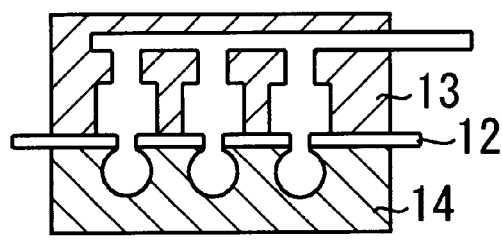
*Fig. 1C2*
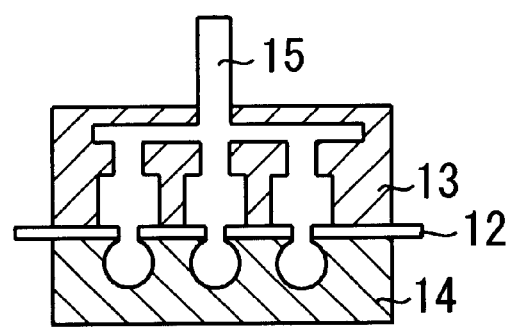
*Fig. 1C3*
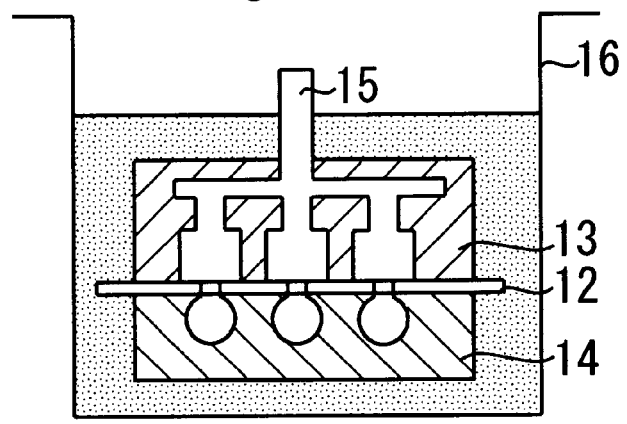

CONTACT TERMINAL ELEMENT, CONTACT TERMINAL DEVICE

BACKGROUND OF THE INVENTION

1. Field of the Invention

The present invention relates to a contact terminal and manufacture thereof, which enables stable measurement of electrical characteristics of an electronic component such as semiconductor devices.

2. Background Art

A conventional method of producing a socket will now be described by taking a metal contact (POGO pin) as an example.

FIG. 6 shows a POGO pin. The POGO pin is made up of four major parts; that is, plungers 1 and 2, a barrel 3, and a spring 4. Manufacture of these parts involves high accuracy, and hence these parts cannot be made by means of metal mold casting. The parts are produced individually by means of machining, and the thus-produced parts are finally assembled into a POGO pin shown in FIG. 6.

As shown in FIG. 7, the POGO pin assembled in the manner shown in FIG. 6 is built into plastic, to thereby form a socket. More specifically, POGO pins 7 which are equal in number to external connection terminals 6 (solder balls) of an integrated circuit 5 to be measured are manually built into insulating plastic 8, thereby producing a socket. The thus-produced socket is placed stationary at a position above an I/F board 10. Hereinafter, the integrated circuit is often referred to simply as "IC". Although a BGA type is shown as an example here, the IC can be a semiconductor device in general.

The IC 5 is set on the socket, and external force 11 is applied to the IC 5 (by way of a socket cover or through use of a raising tool), wherewith both ends of each POGO pin 7 are depressed. As a result, electrical contact is established at a position between an external connection terminal 6 and the POGO pin 7 as well as at a position between the POGO pin 7 and a metal seat 9 of the I/F board 10. Thus, the electrical characteristics of the IC 5 are measured.

Such a conventional method of manufacturing a socket encounters the following problems:

(1) Constituent parts of a POGO pin are individually produced by means of machining, and the thus-produced parts are assembled into a POGO pin. Hence, per-pin manufacturing costs are very high. For this reason, costs incurred by manufacture of a socket increases in proportion to an increase in the number of external connection terminals of an IC to be measured. Further, manufacturing accuracy (i.e., variations in the position and height of a contact) has limits. As things stand, manufacturing costs of a socket are determined essentially by the number of POGO pins to be built into a socket.

(2) The process of manufacturing a socket involves a number of steps, such as a step of producing individual parts of a POGO pin, a step of assembling the parts into a POGO pin, and a step of building POGO pins into a socket. Further, processing pertaining to all these steps is performed manually. Therefore, a manufacturing time for a socket is protracted.

(3) When a POGO pin has been used over a long period of time, the following problem arises.

As a result of electrical contact having been established between an external connection terminal of an IC (i.e., a solder ball) and a POGO pin, a solder alloy is formed at the tip end of the POGO pin. The solder alloy incurs an increase in resistance between the external connection terminal and the POGO pin, thereby preventing establishment of good electrical contact.

The plunger 1 or the plunger 2 in the POGO pin shown in FIG. 6 is sometimes stuck in the barrel 3 as a mechanical operation failure. As a result, physical contact is not established between the POGO pin 7 and the external connection terminal 6 or between the POGO pin 7 and the metal seat 9. In such a case, an IC may be erroneously determined to be defective. Defective POGO pins must be replaced immediately. However, replacement of a defective POGO pin involves a number of operations, such as specification of a defective POGO pin, disassembly of a socket, and replacement of the defective POGO pin with a non-defective one, thus consuming manpower and time.

When a conventional metal contact such as a POGO pin has been used over a long period of time, the contact is susceptible to various failures, because the contact includes mechanical metal parts. As a result of such a failure, an IC under test cannot be measured correctly, and a defective POGO pin must be replaced.

Procedures for replacement of a POGO pin are roughly broken down as follows:

(i) Since a POGO pin is expensive, a defective pin must be replaced on a per-pin basis.

(ii) A defective POGO pin is specified by means of visual inspection and through use of a tester.

(iii) A socket is removed from a test board.

(iv) The socket is disassembled, and a defective pin is ascertained. The thus-specified pin is replaced with a new one, and the POGO pins are re-assembled into a socket.

(v) The socket is attached to the test board.

Here, attention must be paid to steps (i) and (iv). At the time of replacement of a defective pin, the remaining POGO pins may fall to pieces on the floor. In order to prevent such an accident, close attention must be paid to the POGO pins. As mentioned above, a POGO pin is to be replaced on a per-pin basis. If another pin of the same socket has become defective, the defective pin must be replaced through the same replacement procedures. Thus, maintenance of the socket requires consumption of labor and time than required.

The present invention has been conceived to solve the previously-mentioned drawbacks and is aimed at providing a contact structure which enables stable measurement of electrical characteristics of an electronic component such as semiconductor devices. The present invention also provides a method of manufacturing such contact structure.

SUMMARY OF THE INVENTION

According to one aspect of the present invention, a contact terminal element comprises a plate-like heat-resistant insulating member and a plurality of contact terminals formed from conductive resin. The plate-like or film-like heat-resistant insulating member has a plurality of apertures formed therein. The plurality of contact terminals are fitted into the respective apertures of the heat-resistant insulating film, and project from either side of the heat-resistant insulating member.

According to another aspect of the present invention, a contact terminal device comprises a frame member having a hollow section, and a contact terminal element as above is attached to the frame member such that the plurality of contact terminals are located in a hollow section within the frame member.

According to another aspect of the present invention, in a method of manufacturing a contact terminal element, a plate-like or film-like heat-resistant insulating member having a plurality of apertures formed therein is sandwiched between an upper metal mold and a lower metal mold, and each mold has a plurality of cavities for forming a plurality of contact terminals. The upper and lower metal molds are positioned such that each of the cavities of the upper metal mold is brought into mutual communication with each of the cavities of the lower metal mold by way of the apertures of the heat-resistant insulating member. Conductive resin is poured into the thus-communicated cavities. The upper metal mold is separated from the lower metal mold, thereby a contact terminal element is formed.

According to another aspect of the present invention, in a method of manufacturing a contact terminal element, an upper metal mold and a lower metal mold, each having a plurality of cavities for forming a plurality of contact terminals, are positioned such that each of the cavities of the upper metal mold is brought into mutual communication with each of the cavities of the lower metal mold. A plurality of contact terminals are formed by pouring conductive resin to the thus-communicated cavities. The upper metal mold is separated from the lower metal mold. The plurality of contact terminals are separated into pieces. The plurality of contact terminals are fitted into the apertures of the plate-like or film-like heat-resistant insulating member, thereby a contact terminal element is produced.

According to another aspect of the present invention, in a method of manufacturing a contact terminal device, a contact terminal element manufactured by one of the above methods are attached to a frame member, which has a hollow section for receiving an electronic component to be measured.

Other features and advantages of the invention will be apparent from the following description taken in connection with the accompanying drawings.

BRIEF DESCRIPTION OF THE DRAWINGS

FIGS. 1A to 1F are illustrations for describing a structure of a contact according to a first embodiment of the present invention and a method of producing the contact.

DETAILED DESCRIPTION OF THE PREFERRED EMBODIMENTS

Figure 1A:
Figure 1A:
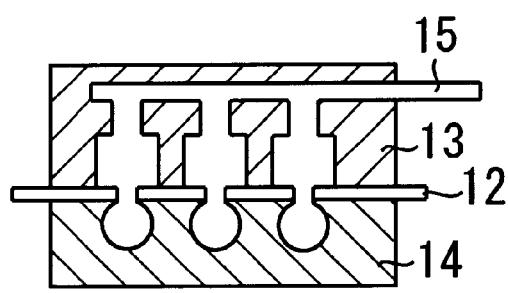
Figure 1A:
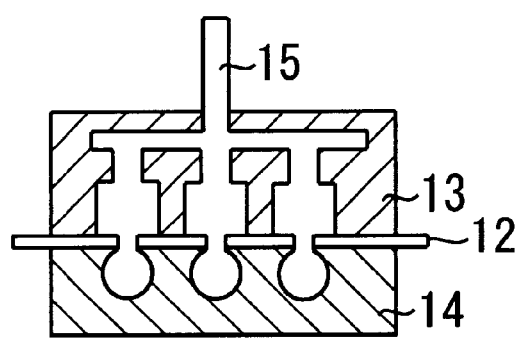

Preferred embodiments of the present invention will be described hereinbelow by reference to the accompanying drawings. Throughout the drawings, like reference numerals designate like or corresponding elements, and repetition of their explanations is simplified or omitted, as required.

The present invention employs a conductive plastic contact structure in lieu of a conventional metal contact structure such as a POGO pin. Use of plastic enables low-cost and short-time mold casting of a contact structure.

First Embodiment

FIGS. 1A to 1F are illustrations for describing a structure of a contact according to a first embodiment of the present invention and a method of producing the contact.

First will be described manufacturing processes. As shown in FIG. 1A, a plurality of through holes (apertures) 12a are formed in predetermined locations on a plate-like or film-like heat-resistant insulating member 12. The heat-resistant insulating member 12 corresponds to, for example, a heat-resistant insulating film 12. The heat-resistant insulating film 12 is formed from, for example, polyimide or silicon rubber.

As shown in FIG. 1B1 or FIG. 1B2, the heat-resistant insulating film 12 having through holes formed therein is sandwiched between an upper metal mold 13 and a lower metal mold 14, both molds being used for molding a contact. A resin inlet hole 15 is formed in the side surface or upper surface of the upper metal mold 13.

As shown in FIG. 1C1 or FIG. 1C2, conductive resin, for example, conductive rubber, is poured into the metal molds by way of the resin inlet hole 15. In order to make the conductive resin poured into the metal molds more uniform, resin maybe poured into the metal molds within a large-sized water tank 16 as shown in FIG. 1C3.

Figure 1D:
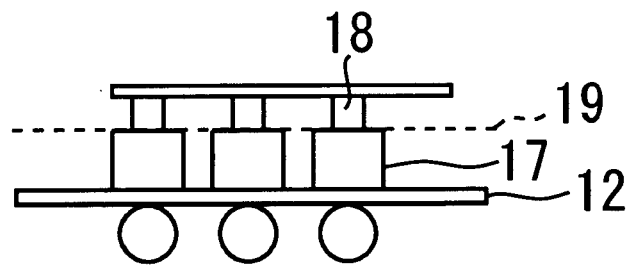

As can be seen from a side elevation view shown in FIG. 1D, the upper metal mold 13 is removed from the lower metal mold 14 after the metal molds have been cooled. A plurality of conductive resin contact terminal 17 (hereinafter called simply "pins") which have been collectively molded by the metal molds are formed on the heat-resistant insulating film 12. At this point in time, burrs 18 are connected to the pins 17. Hence, the burrs 18 are cut along a burr cut line 19, to thereby produce a contact terminal element.

Figure 1E:
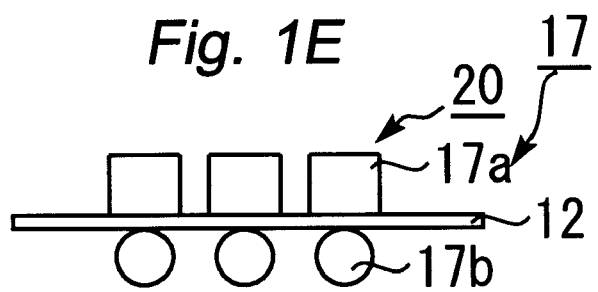

FIG. 1E is a side view showing the thus-formed contact terminal element 20 (hereinafter called simply "contact"). The contact 20 is formed from the plurality of pins 17 fitted into corresponding through holes 12a. In other words, the contact 20 is formed by means of collective formation of the plurality of pins 17 fitted to the respective through holes 12a. Each of the pins 17 is formed from a cylindrical upper portion 17a and a spherical lower portion 17b.

Figure 1F:
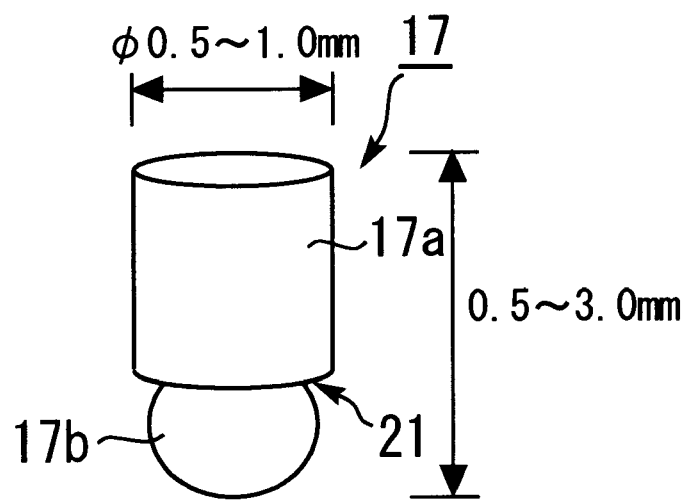

FIG. 1F is an enlarged perspective view showing one of the pins 17 of the thus-formed contact 20.

The pin 17 shown in FIG. 1F has a diameter of 0.5 to 1.0 mm and a height of 0.5 to 3.0 mm or thereabouts. The upper portion 17a assumes a cylindrical shape, and the lower portion 17b assumes a substantially-spherical shape. A constriction section 21 of the pin 17 is bonded to the heat-resistant insulating film 12.

Figure 2A:
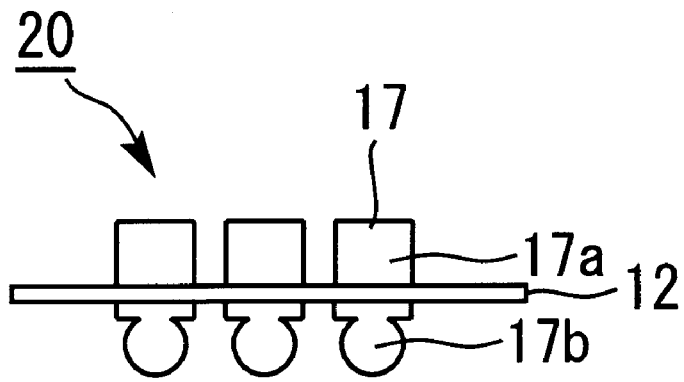
FIGS. 2A and 2B are illustrations for describing a modification of the contact according to the first embodiment.
Figure 2B:
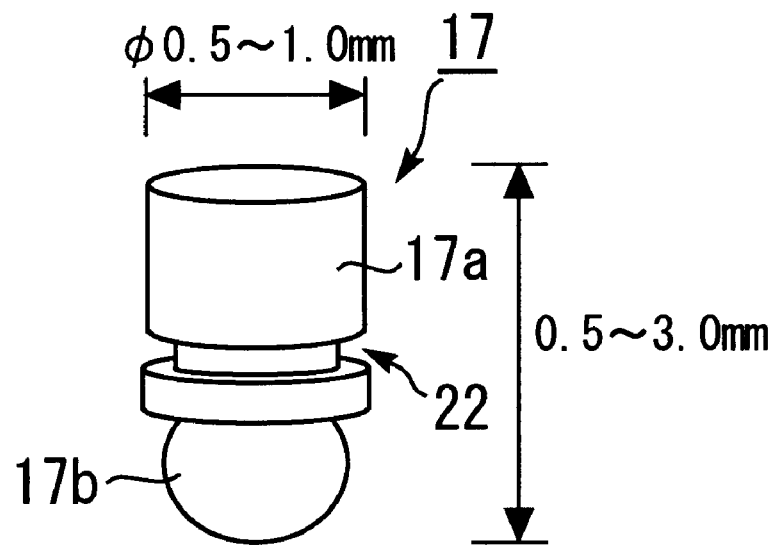

FIGS. 2A and 2B are illustrations for describing a modification of the contact 20 according to the first embodiment. FIG. 2A is a side view of the contact 20, and FIG. 2B is an enlarged perspective view showing the pin 17 of the contact 20. In the pin 17, a constriction section 22 is formed in the lower part of the upper cylindrical portion 17a, and the pin 17 is bonded to the heat-resistance insulating film 12 by way of the constriction section 22. In this case, the lower metal mold, in which conductive resin is to be poured, has cavities, each cavity formed from a thin cylindrical section and a spherical section formed beneath the cylindrical section.

As has been described above, the contact element (contact) 20 according to the first embodiment is formed by means of the plurality of contact terminals (pins) 17 being formed from conductive resin and being fitted into respective apertures 12a of the plate-like or film-like heat-resistant insulating member 12 so as to protrude from either side of the heat-resistant insulating member 12.

Under the method of producing the contact element (contact) 20 according to the first embodiment, the plate-like or film-like heat-resistant insulating member 12 having the plurality of apertures 12a formed therein is sandwiched between the upper metal mold 13 and the lower metal mold 14, each metal mold having a cavity for forming a plurality of contact terminals. At this time, the upper metal mold 13 and the lower metal mold 14 are positioned such that the cavities of the metal molds 13 and 14 are brought into mutual communication by way of the apertures 12a of the heat-resistant insulating member 12. Conductive resin is poured into the thus-communicated cavities, to thereby form a plurality of contact terminals (pins) 17. Subsequently, the upper metal mold 13 is removed from the lower metal mold 14. The plurality of pins 17 are isolated into pieces at the individual apertures 12a of the heat-resistant insulating member 12. Thus, there is formed the contact terminal element (contact) 20 comprising a plurality of pins 17 formed in the heat-resistant insulating member 12.

As has been described above, according to the first embodiment, conductive resin is used as material of pins to be used in a socket. As a result, pins can be collectively formed in a heat-resistant insulating film through use of metal molds, thereby enabling low-cost mass-production of high-precision contacts within a short period of time. Thus, the present invention prevents an increase in costs for manufacturing a socket, which would otherwise be caused by an increase in the number of external contact terminals of an IC to be measured. The present invention is particularly effective in the case of production of a socket having 1,000 pins or more, as well as in the case of mass-production of sockets of a single type.

Figure 7:
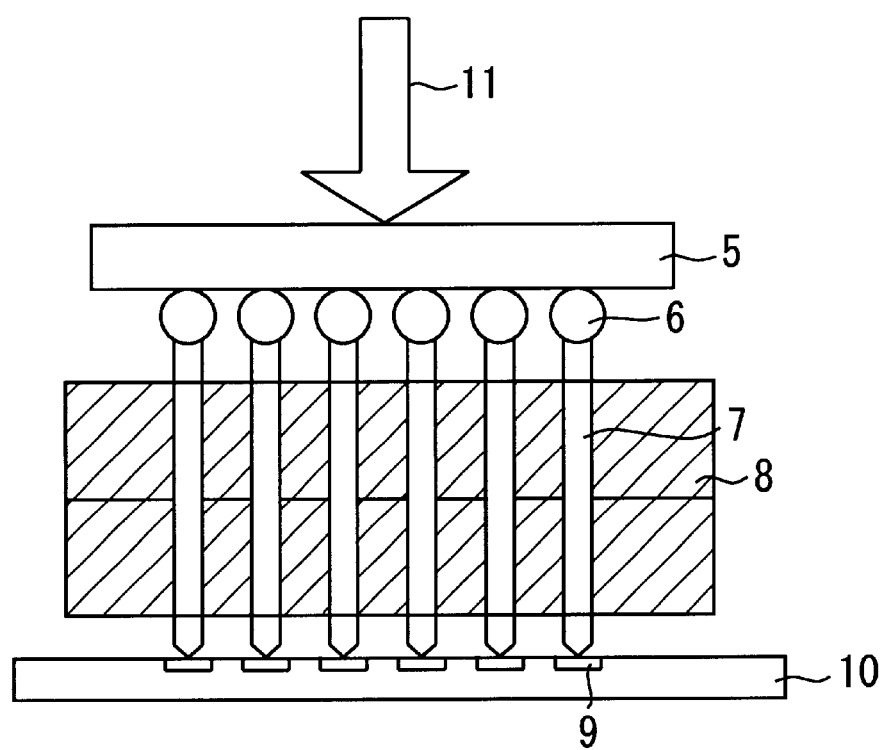
FIG. 7 shows a conventional socket which incorporates the pins shown in FIG. 6.

As has been described in connection with the conventional technique by reference to FIG. 7, an IC to be measured (i.e., a semiconductor device under test) can be electrically measured quickly and efficiently through use of the thus-produced socket 20. Alternatively, the IC can be efficiently tested.

Second Embodiment

Figure 3A:
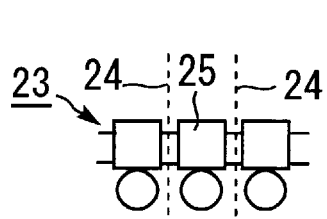
FIGS. 3A and 3B are illustrations for showing procedures of forming contact terminals of conductive resin and a contact terminal element according to a second embodiment of the present invention.
Figure 3B:
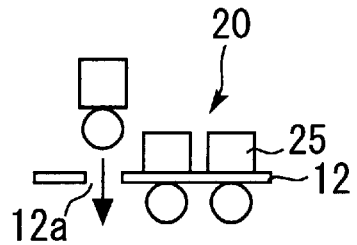

FIGS. 3A and 3B are diagrammatic representations showing procedures of forming contact terminals (pins) of conductive resin, to thereby produce a contact terminal element (contact) according to a second embodiment of the present invention.

As shown in FIG. 3A, according to the second embodiment, a group of conductive resin connection terminals (a group of pins) 23 are produced through use of metal mold casting. More specifically, a group of pins 23, which include continuously-connected single pins 25, are produced from conductive resin through use of only upper and lower metal molds and without use of a film corresponding to the heat-resistant insulating film 12 employed in the first embodiment.

The pins 25 are separated into pieces along a single-piece separation line 24 shown in FIG. 3A. As shown in FIG. 3B, the thus-separated pins 25 are press-fitted into a plurality of through holes (apertures) formed in the heat-resistant insulating film 12 (i.e., a heat-resistant insulating member). By way of the foregoing processes, a contact terminal element (contact) 20 can be produced.

As has been described above, under the method of manufacturing the contact terminal element (contact) 20 according to the second embodiment, the upper metal mold 13 and the lower metal mold 14, each having a cavity for forming a plurality of contact terminals, are positioned such that the cavities of the metal molds 13 and 14 are brought into mutual communication by way of the apertures 12a of the heat-resistant insulating member 12. Conductive resin is poured into the thus-communicated cavities, to thereby form a plurality of contact terminals (pins) 25. Subsequently, the upper metal mold 13 is removed from the lower metal mold 14. The plurality of pins 25 are separated into pieces. The thus-separated pins 25 are fitted into corresponding apertures 12a of the plate-like or film-like heat-resistant insulating member 12. Thus, there is formed the contact terminal element (contact) 20 comprising the plurality of pins 25 formed in the heat-resistant insulating member 12.

Figure 4:
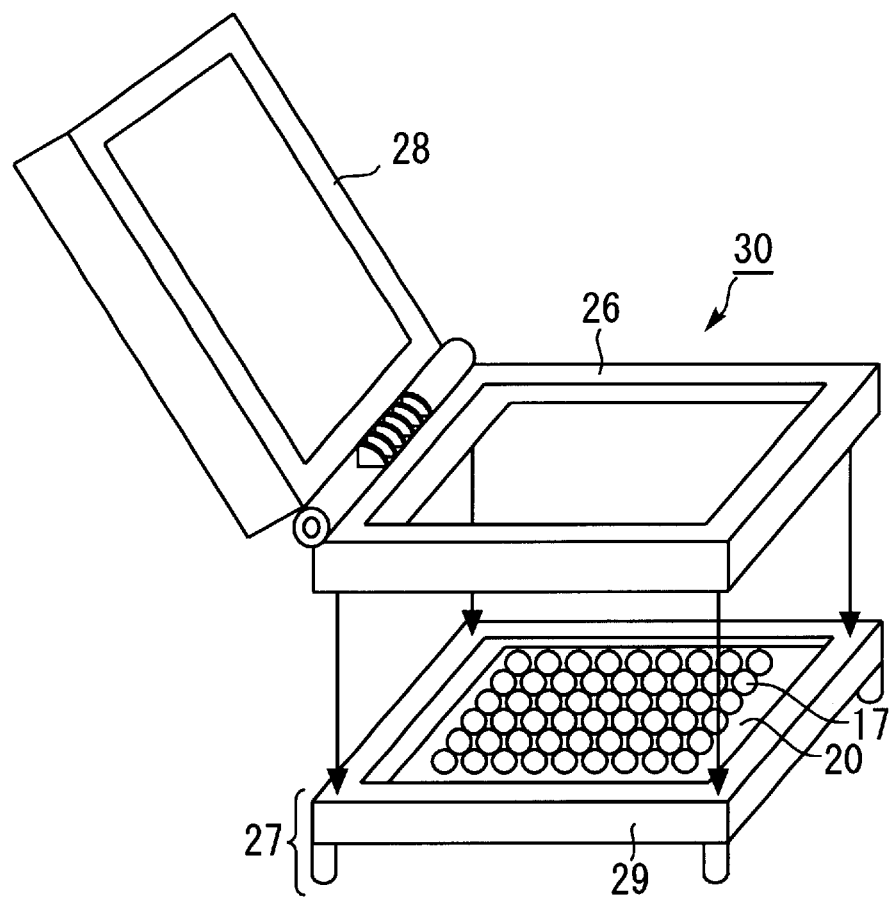
FIGS. 4 and 5 schematically show the configuration of a contact terminal device according to a third embodiment of the present invention.
Figure 5:
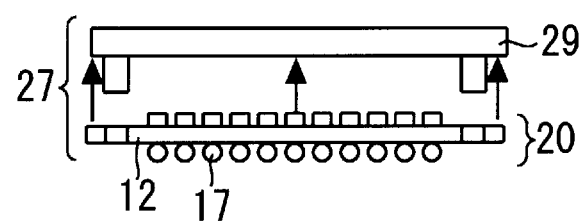
Figure 6:
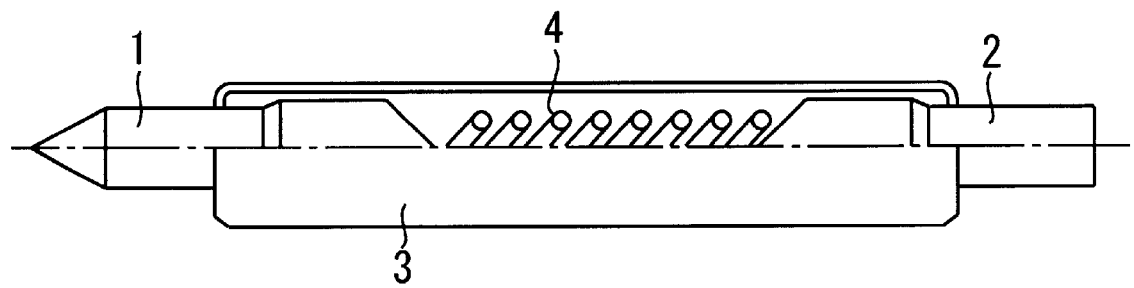
FIG. 6 shows a conventional POGO pin.

In contrast with the first embodiment which is effective for producing a socket having a plurality of pins (1000 pins or more), the present embodiment enables mass-production of the pins 25 only. Therefore, regardless of the type of socket, the present embodiment is effective for producing a socket having a comparatively-small number of pins (hundreds of pins) as well as for small-lot production of a wide variety of sockets Third Embodiment FIGS. 4 and 5 schematically show the configuration of a contact terminal device (hereinafter abbreviated as "socket") according to a third embodiment of the present invention. FIG. 4 is an exploded perspective view of a socket, and FIG. 5 is a cross-sectional view of a contact of the socket.

The third embodiment describes an example of manufacture of a socket using the contact element (abbreviated as a "contact") manufactured in the first or second embodiment.

As shown in FIG. 4, the socket according to the present embodiment is roughly made up of two frames; i.e., a guide section 26 and a contact section 27.

The guide section 26 is a frame (frame member) having the function of guiding the exterior of an IC, and a closure 28 can be attached to the guide section 26, as required. The guide section 26 can be used for manual measurement of an IC and can be used in conjunction with a handler.

The contact section 27 is made up of an IC positioning section 29 and the contact 20. As shown in FIG. 5, the contact 20 is bonded to the positioning section 29 in order to impart a contact function to the contact section 27. The positioning section 29 is a frame (frame member) having the contact 20 provided thereon and maintains the contact 20 in position. The positioning section 29 is imparted with the function of guiding an IC, when necessary.

The guide section 26 and the contact section 27 are bonded together by means of an attachment, thus embodying a socket function.

As has been described above, the contact terminal device 30 (socket) according to the present embodiment is formed by means of fitting the contact terminal element (contact) 20 described in connection with the first or second embodiment into the frame member 29 or 26 having a hollow section such that the plurality of contact terminals (pins) 17 or 25 are positioned within the frame member 29 or 26.

Under the method of manufacturing the contact terminal device (socket) 30 according to the third embodiment, manufacture of the contact terminal element (contact) 20 described in connection with the first or second embodiment is followed by attachment of the contact 20 to the frame member 26 or 29 having a hollow portion for receiving an electronic device to be measured, thus producing a socket.

More specifically, the heat-resistant insulating film 12 on which the pins 17 or 25 of conductive resin are formed is formed so as to assume a replaceable socket structure.

As mentioned above, conventional metal contact terminals such as POGO pins encounter a problem of maintenance of a socket, such as replacement of a defective POGO pin, consuming time and labor than required. However, in the event that a pin of the socket according to the present invention has become defective, the contact section 27 per se is replaced with a new one. Although there still remains a necessity for ascertaining a defective pin, there can be obviated a necessity of specifying a defective pin. Moreover, pins of one socket are subjected to replacement, and hence the rate of occurrence of a failure in the same socket can be reduced.

Thus, manpower and time required for performing maintenance of a socket can be minimized, and hence an improvement in the ease of maintenance of a socket can be expected.

Now, the effects and advantages of the present invention may be summarized as follows.

In one aspect, the present invention provides a contact terminal element (contact) or a contact terminal device (socket) formed by means of fitting contact terminals (pins) of conductive resin into a plurality of apertures formed in a plate-like or film-like heat-resistant insulating member. Thus, the present invention enables production of a contact which has a plurality of pins and facilitates maintenance, as well as production of a socket using the contact. Moreover, the present invention enables stable measurement of electrical characteristics of an electronic component, such as a semiconductor device.

In another aspect, according to the present invention, a contact terminal element (contact) or a contact terminal device (socket) is produced by sandwiching a plate-like or film-like heat-resistant insulating film having a plurality of apertures being formed therein between an upper metal mold and a lower metal mold, and pouring conductive resin into the cavity defined between the upper and lower metal molds.

Conductive resin contact pins are collectively formed on an insulating film, thereby reducing manufacturing costs, which would be induced by a reduction in the number of manufacturing steps, and shortening the overall manufacturing process The present invention is particularly effective for producing a socket having a plurality of pins; for example, 1000 pins or more, thus preventing an increase in costs which would otherwise be caused by an increase in the number of pins. Further, maintenance of a socket can be improved.

In another aspect, according to the present invention, after a plurality of contact terminals (pins) have been formed by means of pouring conductive resin into metal molds, the pins are separated into pieces. The thus-separated pins are fitted into corresponding apertures formed in a plate-like or film-like heat-resistant insulating member, thereby producing a contact terminal element (contact) or a contact terminal device (socket).

Collective formation of contact pins from conductive resin enables a reduction in manufacturing costs induced by a reduction in the number of manufacturing steps, and shortening the overall manufacturing process. Since the present invention enables low-cost mass-production of pins, the present invention is effective for the case of production of a socket having a comparatively small number of pins (hundreds of pins) and small-lot production of a wide variety of sockets, regardless of the type of socket.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-211909, filed on Jul. 12, 2000 including specification, claims, drawings and summary, on which the Convention priority of the present application is based, are incorporated herein by reference in its entirety.

What is claimed is:

1. A contact terminal element comprising:

a single-layer plate-like or film-like heat-resistant insulating member having a plurality of apertures formed therein; and a plurality of contact terminals fitted into the respective apertures of the heat-resistant insulating film, each of said contact terminals projecting from either side of the heat-resistant insulating member, and each of said contact terminals being formed from conductive resin, wherein portions of both sides of the single-layer insulating covered by the conductive resin are exposed.

2. A contact terminal device comprising:

a frame member having a hollow section; and a contact terminal element comprising:

a plate-like or film-like heat-resistant insulating member having a plurality of apertures formed therein; and a plurality of contact terminals fitted into the respective apertures of the heat-resistant insulating film, each of said contact terminals projecting from either side of the heat-resistant insulating member, and each of said contact terminals being formed from conductive resin, wherein the contact terminal element is attached to the frame member such that the plurality of contact terminals are located in the hollow section within the frame member.

* * * * *